United States Patent [19]

Edwards

[11] 4,199,697
[45] Apr. 22, 1980

[54] PULSE AMPLITUDE MODULATION SAMPLING GATE INCLUDING FILTERING

[75] Inventor: Gary A. Edwards, Hazeldean, Canada

[73] Assignee: Northern Telecom Limited, Montreal, Canada

[21] Appl. No.: 922,224

[22] Filed: Jul. 5, 1978

[51] Int. Cl.² .................... H03K 17/60; H03K 17/02
[52] U.S. Cl. ................................. 307/352; 307/251; 328/151
[58] Field of Search .................... 307/251, 352, 353; 328/151, 162; 330/9; 179/15 A

[56] References Cited
PUBLICATIONS

D. Fullagar et al., "Dual F.E.T.-Input Operational Amplifier", New Electronics, vol. 8, No. 6, pp. 79, 86, Mar. 18, 1975.

*Primary Examiner*—John Zazworsky
*Attorney, Agent, or Firm*—Achmed N. Sadik

[57] ABSTRACT

The present invention provides a pulse amplitude modulation sampling gate using inexpensive integrated devices having a novel feedback arrangement. The addition of a few passive components to the basic sampling gate allows the gate to coact as a three pole high pass filter. Costs are reduced by this approach by a large factor.

6 Claims, 4 Drawing Figures

PULSE AMPLITUDE MODULATION SAMPLING GATE INCLUDING FILTERING

FIELD OF THE INVENTION

The present invention relates to pulse amplitude modulation sampling gates in general and more particularly to a novel pulse amplitude modulation (PAM) sampling gate including a three pole high pass filter.

BACKGROUND AND SUMMARY OF THE INVENTION

It is one of the functions of a pulse code modulation (PCM) channel bank to receive voice frequency (VF) signals from a plurality of VF lines and deliver them encoded and multiplexed in a digital time division multiplexed format. The standard for North America is the 24 channel T1 format.

The first stage of this process is the sampling of the analog (VF) signal to obtain a pulse amplitude modulated signal. Twenty-four of these channels are time multiplexed onto a common bus. These PAM samples are then encoded one at a time by the PCM encoder in the transmit unit of the channel bank.

The VF signal is band limited to 3400 Hz by a low pass active filter. Additionally 60 Hz filtering is needed in the channel bank. Currently a passive inductor/-capacitor (LC) filter is provided for the 60 Hz filtering and the PAM samples are obtained in a bipolar gate. However, the gate and passive filtering prove to be expensive.

The present invention uses inexpensive integrated devices to reduce the cost. A novel circuit arrangement is provided to obtain the performance of the bipolar gate at reduced cost. 60 Hz filtering with this arrangement was accomplished by addition of a few additional passive components eliminating a 60 Hz filter stage prior to the bipolar gate and reducing cost by a large factor.

It was found that by incorporating an a-c coupling capacitor in the feedback loop of a PAM sampling gate, low output offset voltage (or pedestal) was obtained. In the prior art the a-c coupling capacitor was utilized to couple the output of the sampling gate to the following circuit. Further, the addition of another resistor-capacitor (RC) network at the input of the sampling gate enables the gate to coact as a three pole high pass filter.

Thus in accordance with the invention there is provided a pulse amplitude modulation sampling gate having an input and an output, a differential input operational amplifier, a first sampling switch connected between the output of said differential input operational amplifier and said output characterized in that said output, through a second sampling switch, is a-c coupled to the non-inverting input of said operational amplifier.

Further, in accordance with the invention there is provided a pulse amplitude modulation gate which coacts as a three pole high pass filter additionally including a resistor-capacitor network connected at the input.

BRIEF DESCRIPTION OF THE DRAWINGS

The preferred embodiment of the invention will now be described with reference to the accompanying drawings in which.

DESCRIPTION OF THE PREFERRED EMBODIMENT

Figure 1:
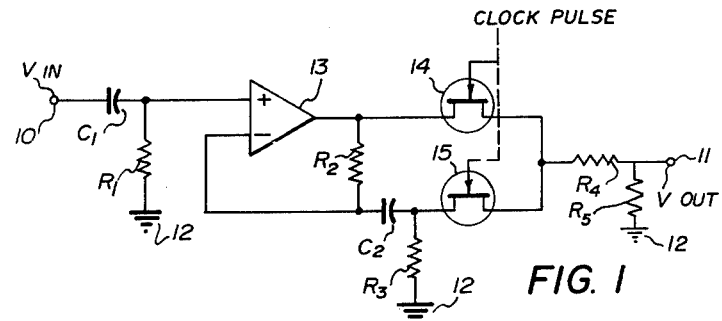
FIG. 1 is a schematic circuit diagram of an embodiment of a PAM sampling gate using an operational amplifier and a JFET analog switch without filtering according to the invention.

Referring to FIG. 1 the PAM gate comprises an input terminal 10 for connecting an input analog signal $V_{in}$ thereto, an output terminal 11 for connecting an output PAM signal $V_{out}$ therefrom and a common or ground terminal 12, suitable for connection in the North American Standard T1 carrier system. The PAM gate includes a single differential-input operational amplifier (op-amp) 13 which is preferably a junction field effect transistor (JFET). JFETs are preferred due to their low cost and relatively high switching speed. A first capacitor $C_1$ is connected between the input terminal 10 and the non-inverting input terminal of the op amp 13. A first resistor $R_1$ is connected between the non-inverting terminal of the op amp 13 and the common terminal 12. A second resistor $R_2$ is connected between the output terminal of the op amp 13 and the inverting terminal of the op amp 13. A second capacitor $C_2$ and a third resistor $R_3$ are connected in series between the inverting input terminal of the op amp 13 and the common terminal 12. A pair of JFET analog switches having three terminals, source and drain current carrying terminals and one gate control terminal are used. The first JFET switch 14 has its source terminal connected to the output terminal of the op amp 13. The second JFET switch 15 has its source terminal connected to the junction of the capacitor $C_2$ and the resistor $R_3$. The drain terminal of both the JFET switches 14 and 15 are connected together. A fourth resistor $R_4$ is connected between the junction of the drain terminals of JFET switches 14 and 15 and the output terminal 11. A fifth resistor $R_5$ is connected between the output terminal 11 and the common terminal 12.

Figure 2:
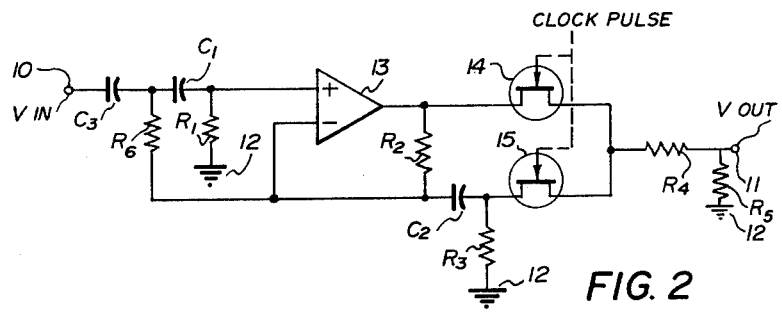
FIG. 2 is a schematic circuit diagram of an embodiment of a PAM sampling gate including a three pole high pass filter using a JFET operational amplifier and a JFET analog switch according to the invention.

FIG. 2 illustrates the PAM gate with filtering, which is the circuit of FIG. 1 with an additional capacitor $C_3$ connected between the input terminal 10 and the capacitor $C_1$.

As well there is an additional resistor $R_6$ connected between the junction of capacitors $C_1$ and $C_3$ and the inverting terminal of the op amp 13.

Figure 3:
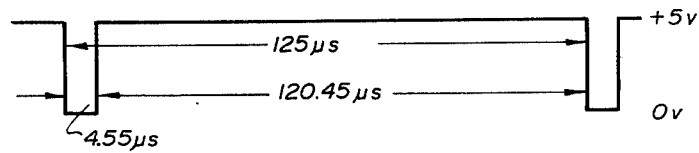
FIG. 3 illustrates the waveform of the clock controlling a PAM sampling gate.

In operation a VF signal is introduced to the input terminal 10. The switches are controlled by a waveform shown in FIG. 3. The switches are closed during 4.55 μsec. at zero volts and open for 120.45 μsec. at 5 volts. The total cycle is 125 μsec.

As an example to show the reduction of output offset assume that:
$C_2 = 0.47$ μf
$R_2 = 10$ KΩ
$R_3 = 10$ KΩ
$R_4 = 22$ Ω
$R_5 = 1$ KΩ.

The switches are part of an LF13201 single pole single throw (SPST) JFET analog switch and the operational amplifier is an LF355 with an input offset voltage maximum of 10 mv, typical bandwidth 2.5 MHz, slew rate typical 5 V/μsec. and due to its JFET input stage, input bias currents of 200 picoamps and maximum offset currents of 50 picoamps in our example.

During the off time $T_{off}$ the switches are open thus disconnecting the op amp from the gate output terminal 11. Capacitor $C_2$ charges via $R_3$ to the output offset voltage of the operational amplifier with a time constant $\tau_1 = R_3 C_2$ for 120.45 μsec.

During the on time $T_{on}$ while the PAM sample is being taken and the switches are closed so that the op amp output is connected to the gate output terminal, the capacitor $C_2$ is effectively connected in parallel with resistor $R_2$ in a feedback loop. The charge on $C_2$ built during the off time supplies a voltage to the inverting input terminal of such a polarity to cancel the offset voltage at the op amp output terminal. The time constant for the discharge is $\tau_2 = R_2 C_2$.

The ratio of $$\frac{T_{off}}{\tau_1} = \frac{120.45 \times 10^{-6}}{4.7 \times 10^{-3}} = 25.628 \times 10^{-3} \quad (1)$$

The ratio of $$\frac{T_{on}}{\tau_2} = \frac{4.55 \times 10^{-6}}{4.7 \times 10^{-3}} = .9681 \times 10^{-3} \quad (2)$$

Equations (1) and (2) show that both $\tau_1$ and $\tau_2$ are relatively long time constants.

Any output offset produced will be limited by the on-off time ratio and the respective time constants $\tau_1$ and $\tau_2$.

During the off time the charging equation is:

$$\left(\frac{dv}{dt}\right)_{off} = (V_{offset} - V_{c_2})(1 - e^{-\frac{T_{off}}{\tau_1}}) \quad (3)$$

where:
$V_{offset}$ is the output offset voltage and
$V_{c2}$ is the voltage across capacitor $C_2$ as $T_{off} \to 0$       as $T_{off} \to \infty$ $\left(\frac{dv}{dt}\right)_{off} \to 0$       $\left(\frac{dv}{dt}\right)_{off} \to (V_{offset} - V_{c_2})$ During the on time the discharging equation is:

$$\left(\frac{dv}{dt}\right)_{on} = V_{c_2}(1 - e^{-\frac{T_{on}}{\tau_2}}) \quad (4)$$

as $T_{on} \to 0$       as $T_{on} \to \infty$ $\left(\frac{dv}{dt}\right)_{on} \to 0$       $\left(\frac{dv}{dt}\right)_{on} \to V_{c_2}$ For an equilibrium the charge and discharge equations must be equal.

$$\therefore (V_{offset} - V_{c_2})(1 - e^{-\frac{T_{off}}{\tau_1}}) = V_{c_2}(1 - e^{-\frac{T_{on}}{\tau_2}}) \quad (5)$$

To solve—substituting equations (1) and (2)—Equation (5) becomes:

$$(V_{offset} - V_{c_2})(1 - e^{-.025628}) = V_{c_2}(1 - e^{-.0009681}) \quad (6)$$

Assume $V_{offset} = 100$ mV $$\therefore (1000 \times 10^{-3} - V_{c_2})(1 - .974698) = V_{c_2}(1 - .999032) \quad (7)$$

Solve for $V_{c_2}$ $$25.302 \times 10^{-3} - .025302 V_{c_2} = V_{c_2}(-.000968) \quad (8)$$
$$V_{c2} = \frac{25.302}{.02627} \times 10^{-3} = 963.15 \text{ mV}$$

This voltage $V_{c2}$ is not directly equal to the output offset voltage $V_{offset}$ due to the fact that the switches have a closed resistance $R_s$ of approximately 150 Ω. Switch 15 is effectively an attenuator with $R_3$ relative to the output offset, so when it is closed the charge on $C_2$ is attenuated by the following ratio $$\frac{R_2}{R_2 + \frac{R_s R_3}{R_s + R_3}} = \frac{1}{1 + \frac{R_s R_3}{R_2(R_s + R_3)}} \quad (9)$$

Solving $$\text{attenuation} = \frac{1}{1 + \frac{150 \times 10000}{10000 \times 10150}} = .9854 \quad (10)$$

The effective voltage $V_{c_2} = V_{c_2}'$ $$\therefore V_{c_2}' = .9854 \times V_{c_2} = .9854 \times 963.15 = 949.13 \text{ mV} \quad (11)$$

∴ The pedestal produced across $R_4 + R_5$ is $V_p$ $$V_p = V_{offset} - V_{c_2}' = 1000 \text{ mV} - 949.13 \text{ mV} = 50.87 \text{ mV} \quad (12)$$

$V_p$ is further attenuated by the divider chain of $R_4 + R_5$.

Thus the final output offset $V_p'$ seen at output terminal 11 is:

$$V_p' = V_p \frac{R_5}{R_4 + R_5} = 50.87 \times \frac{1000}{1022} = 49.77 \text{ mV} \quad (13)$$

Thus the d-c output offset of our example of 1000 mV is reduced to 49.77 mV or greater than a factor of twenty.

The PAM gate, because of its use of an operational amplifier, can coact as a three pole high pass filter with the addition of a capacitor and inductor at the input.

Figure 4:
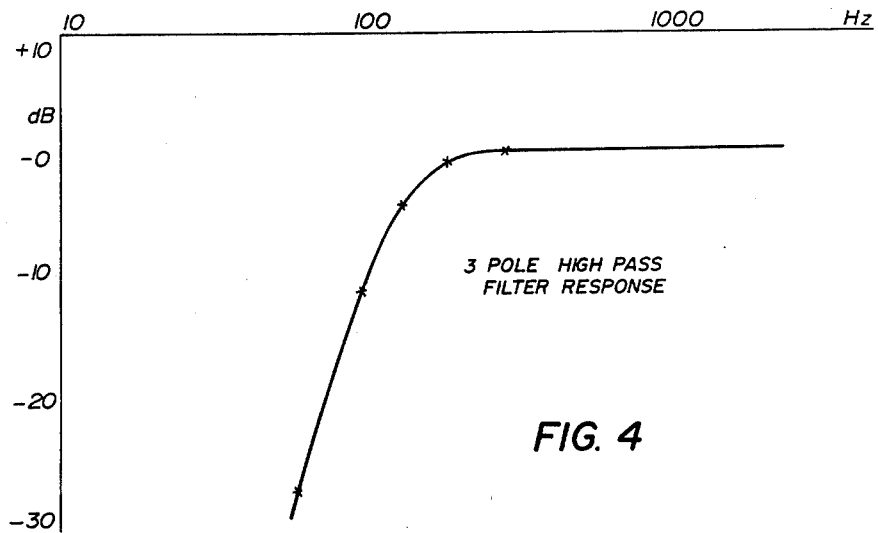
FIG. 4 illustrates the frequency response of the PAM sampling gate coacting as a three pole high pass filter.

The overall filter response curve is shown in FIG. 4. It is shown that at 60 Hz the response is in the order of 27 dB down with a required response minimum of 20 dB down.

Two poles of the filter are due to the action of the network at the input of the operational amplifier. Thus there is a pole at $f_1 = 1/2\pi C_1 R_1$ and another at $f_2 = 1/2\pi C_3 R_6$. There is a double zero that occurs at the origin.

The third pole response is complicated by the switching of switches 14 and 15. The switching causes the pole and zero to shift in comparison with the pole location if there was no switching. Thus the third pole occurs at:

$$f_3 = \frac{1}{2\pi C_3 R_3} \frac{T_{off}}{T_{on} + T_{off}}$$

and the third zero occurs $$Z_3 = \frac{1}{2\pi C_2 R_2} \frac{T_{on}}{T_{off} + T_{on}}.$$

Due to the fact that $T_{off}/(T_{on}+T_{off})$ is very close to one, the shift of the pole is small.

However, due to the fact that $T_{on}/(T_{on}+T_{off})$ is very much less than one, the shift of the zero is much larger.

What is claimed is:

1. A pulse amplitude modulation sampling gate having an input terminal and an output terminal, a differential operational amplifier having an non-inverting input, an inverting input and an output, said input terminal connected to said non-inverting input of said differential input operational amplifier, a first sampling switch connected between said output of said differential input operational amplifier and said output terminal, characterized in that said output terminal, through a second sampling switch is a-c coupled to said inverting input of said differential input operational amplifier.

2. A pulse amplitude modulation sampling gate as claimed in claim 1 wherein said inverting input is a-c coupled to said output terminal by means of a capacitor.

3. A pulse amplitude modulation sampling gate as claimed in claim 2 wherein said capacitor is connected at the inverting input side thereof, to the output of said differential operational amplifier via a resistance and at the other side thereof via a second resistance to a common terminal of said gate.

4. A pulse amplitude modulation sampling gate as claimed in claim 3 wherein said input is connected to the non-inverting input terminal of said differential operational amplifier through a second capacitor and said non-inverting input terminal is also connected to said common terminal via a third resistance.

5. A pulse amplitude modulation sampling gate comprising:
   input, output and common terminals;
   a differential input operational amplifier having inverting and non-inverting input terminals and an output terminal;
   a first capacitor connected between said input terminal and said non-inverting input terminal;
   a first resistor connected between said non-inverting input terminal and said common terminal;
   a second resistor connected between said output terminal of said operational amplifier and said inverting terminal thereof;
   a second capacitor and a third resistor connected in series between said inverting input terminal and said common terminal;
   first and second analog switches having three terminals each, first and second current carrying terminals and one control terminal;
   said control terminals connected to accept an external control waveform;
   said first analog switch having its first current carrying terminal connected to said output terminal of said operational amplifier;
   said second analog switch having its first current carrying terminal connected to the junction of said second capacitor and said third resistor;
   said second current carrying terminals of said first and second analog switches connected together;
   a fourth resistor connected between the junction of said second terminals and said output terminal;
   a fifth resistor connected between said output terminal and said common terminal.

6. A pulse amplitude modulation sampling gate as claimed in claim 5 coacting as a three pole high pass filter comprising additionally:
   a third capacitor connected between said input terminal and said first capacitor;
   a sixth resistor connected between the junction of said third and first capacitors and said inverting input terminal.

* * * * *